(12) United States Patent
Bosund et al.

(10) Patent No.: US 10,576,445 B2
(45) Date of Patent: Mar. 3, 2020

(54) APPARATUS AND METHOD FOR PROCESSING PARTICULATE MATTER

(71) Applicant: BENEQ OY, Espoo (FI)

(72) Inventors: Markus Bosund, Espoo (FI); Risto Peltonen, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 16/311,200

(22) PCT Filed: Jun. 22, 2017

(86) PCT No.: PCT/FI2017/050472
§ 371 (c)(1),
(2) Date: Dec. 19, 2018

(87) PCT Pub. No.: WO2017/220867
PCT Pub. Date: Dec. 28, 2017

(65) Prior Publication Data
US 2019/0184363 A1   Jun. 20, 2019

(30) Foreign Application Priority Data
Jun. 23, 2016   (FI) .................................... 20165524

(51) Int. Cl.
*B01J 8/40* (2006.01)
*C23C 16/442* (2006.01)
(Continued)

(52) U.S. Cl.
CPC .............. *B01J 8/40* (2013.01); *C23C 16/442* (2013.01); *C23C 16/4417* (2013.01);
(Continued)

(58) Field of Classification Search
CPC ....................................................... B01J 8/40
See application file for complete search history.

(56) References Cited

U.S. PATENT DOCUMENTS

| 6,562,140 B1 | 5/2003 | Bondestam et al. |
| 8,522,716 B2 | 9/2013 | Kadkhodayan et al. |

(Continued)

FOREIGN PATENT DOCUMENTS

| JP | 2016020418 A | 2/2016 |
| KR | 20120086865 A | 8/2012 |

(Continued)

OTHER PUBLICATIONS

International Search Report issued by the Finnish Patent and Registration Office acting as the International Searching Authority in relation to International Application No. PCT/FI2017/050472 dated Oct. 23, 2017 (4 pages).

(Continued)

*Primary Examiner* — Robert A Vetere
(74) *Attorney, Agent, or Firm* — Robert P. Michal, Esq.; Carter, DeLuca & Farrell LLP (57) ABSTRACT

An apparatus and method for processing particulate matter by exposing the particulate matter to successive surface reactions of at least a first and a second gaseous precursor according to the principles of atomic layer deposition. The apparatus includes a vacuum chamber, a reaction chamber for particulate matter, wherein the reaction chamber is provided inside the vacuum chamber, a vibration mechanism for vibrating particulate matter inside the reaction chamber; and a precursor system arranged to supply the at least first and second gaseous precursors through the reaction chamber for subjecting the particulate matter to the at least first and second gaseous precursors. The method includes the steps of supplying the at least first and second gaseous precursors through the reaction chamber for subjecting the particulate matter to the at least first and second gaseous precursors, and vibrating particulate matter inside the reaction chamber.

9 Claims, 5 Drawing Sheets (51) Int. Cl.
*C23C 16/455* (2006.01)
*C23C 16/44* (2006.01)
(52) U.S. Cl.
CPC .. *C23C 16/45502* (2013.01); *C23C 16/45527* (2013.01); *C23C 16/45544* (2013.01); *C23C 16/45553* (2013.01); *C23C 16/45555* (2013.01)

(56) References Cited

U.S. PATENT DOCUMENTS

| | | | |
|---|---|---|---|
| 2003/0207032 A1 | 11/2003 | Ahn et al. | |
| 2004/0007179 A1* | 1/2004 | Lee | C23C 16/45544 118/715 |
| 2006/0062902 A1* | 3/2006 | Sager | B22F 1/0018 427/74 |
| 2009/0155590 A1 | 6/2009 | Kelder et al. | |
| 2009/0169743 A1* | 7/2009 | Soininen | C23C 16/45525 427/255.7 |
| 2009/0179157 A1* | 7/2009 | Sinclair | C23C 14/228 250/423 R |

FOREIGN PATENT DOCUMENTS

| | | |
|---|---|---|
| WO | 2013171360 A1 | 11/2013 |
| WO | 2014114844 A1 | 7/2014 |

OTHER PUBLICATIONS

Written Opinion of the International Searching Authority issued by the Finnish Patent and Registration Office acting as the International Searching Authority in relation to International Application No. PCT/FI2017/050472 dated Oct. 23, 2017 (6 pages).

Hakim et al., Conformal Nanocoating of Zirconia Nanoparticles by Atomic Layer Deposition in a Fluidized Bed Reactor, IOP Publishing, Nanotechnology 16 (2005), S375-S381.

Hakim, et al., "Nanocoating Individual Silica Nanoparticles by Atomic Layer Deposition in a Fluidized Bed Reactor", Chemical Vapor Deposition (2005), 11, 420-425.

Liang, et al., "Alumina Atomic Layer Deposition Nanocoatings on Primary Diamond Particles Using a Fluidized Bed Reactor", Diamond & Related Materials 17 (2008), 185-189.

* cited by examiner

APPARATUS AND METHOD FOR PROCESSING PARTICULATE MATTER

CROSS-REFERENCE TO RELATED APPLICATIONS

This application is a National Phase entry under 35 U.S.C. 371 of PCT International Application No. PCT/FI2017/050472 filed Jun. 22, 2017, which claims priority to Finnish Patent Application No. 20165524, filed Jun. 23, 2016, the disclosure of each of these applications is expressly incorporated herein by reference in their entirety.

FIELD OF THE INVENTION

The present invention relates to an apparatus for processing particulate matter. The present invention also relates to method for processing particulate matter.

BACKGROUND OF THE INVENTION

In ALD applications, typically two gaseous precursors are introduced into the ALD reactor in separate stages. The gaseous precursors effectively react with the substrate surface, resulting in deposition of a single atomic layer. The precursor stages are typically followed or separated by a purge stage that eliminates the excess precursor from the surface of the substrate prior to the separate introduction of the other precursor. Therefore an ALD process requires alternating in sequence the flux of precursors to the surface of the substrate. This repeated sequence of alternating surface reactions and purge stages between is a typical ALD deposition cycle.

Particulate matter can be exposed to a condition in which a fluidized bed is formed in a vessel under conditions that cause the particulate matter to act in a fluidic manner. This is usually achieved by the introduction of pressurized gas through the particulate matter.

When providing coating to particulate matter with an ALD process problems arise since the coating should be applied all around the particulate matter and the particulate matter easily agglomerates.

BRIEF DESCRIPTION OF THE INVENTION

An object of the present invention is to provide an apparatus so as to solve the above problems. The objects of the invention are achieved by an apparatus and a method which are characterized by what is stated in the independent claims. The preferred embodiments of the invention are disclosed in the dependent claims.

The invention is based on the idea of coating particulate matter with ALD method such that vibration is provided to the reaction chamber, said reaction chamber comprising particulate matter. The vibration of the particulate matter assists in fluidization so that the first and second gaseous precursors reach all over the particulate matter and they are coated all around. The fluidization may further be assisted through heating and in a preferred embodiment of the invention at least one heater is arranged in the vacuum chamber for providing heat to the reaction chamber.

The apparatus according to the invention for processing particulate matter by exposing the particulate matter to successive surface reactions of at least a first and a second gaseous precursor according to the principles of atomic layer deposition method comprises a vacuum chamber and a reaction chamber provided inside the vacuum chamber, the reaction chamber is for the particulate matter, a vibration mechanism for vibrating the particulate matter inside the reaction chamber, and a precursor system arranged to supply the at least first and second gaseous precursors through the reaction chamber for subjecting the particulate matter to the at least first and second gaseous precursors. The vibration mechanism is operatively connected to the apparatus and arranged to vibrate at least part of the apparatus for vibrating particulate matter inside the reaction chamber. This means that in one embodiment of the invention the vibration mechanism is arranged to vibrate the reaction chamber or part of the reaction chamber such as a bottom of the reaction chamber or walls of the reaction chamber. In another embodiment of the invention the vibration mechanism is arranged to vibrate a container arranged inside the reaction chamber or the vibration mechanism is arranged to vibrate both the reaction chamber and the container. The vibration mechanism may vibrate the container only partly such that the vibration mechanism vibrates only the bottom of the container or the top part of the container or the vibration mechanism may vibrate the container entirely. The vibration mechanism may be arranged to indirectly vibrate the reaction chamber or the container such that the vibration mechanism is arranged to vibrate a platform onto which the reaction and/or the container is arranged.

The method according to the invention for processing particulate matter in an apparatus by exposing the particulate matter to successive surface reactions of at least a first and a second gaseous precursors according to the principles of atomic layer deposition method, in which the apparatus comprises a vacuum chamber, a reaction chamber, which the reaction chamber is provided inside the vacuum chamber, a vibration mechanism and a precursor system, comprises the steps of supplying the at least first and second gaseous precursors through the reaction chamber for subjecting the particulate matter to the at least first and second gaseous precursors, and vibrating particulate matter inside the reaction chamber.

An advantage of the apparatus and the method of the invention is that the particulate matter is coated in controlled circumstances inside a vacuum chamber such that the reaction chamber is surrounded by vacuum and the gaseous precursors are supplied through the vacuum chamber to the reaction chamber. Vibrating the particulate matter for creating movement to the particulate matter generates uniform coating to the particulate matter because the gaseous precursors reach all over the particulate matter. Another advantage of the apparatus and the method of the invention is that by vibrating the particulate matter and creating a flow such that the particulate matter moves and at the same time providing gaseous precursor flow into the reaction chamber for coating the particulate matter and further applying indirect heat from the vacuum chamber to the reaction chamber creates a properly fluidized coated particulate matter.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
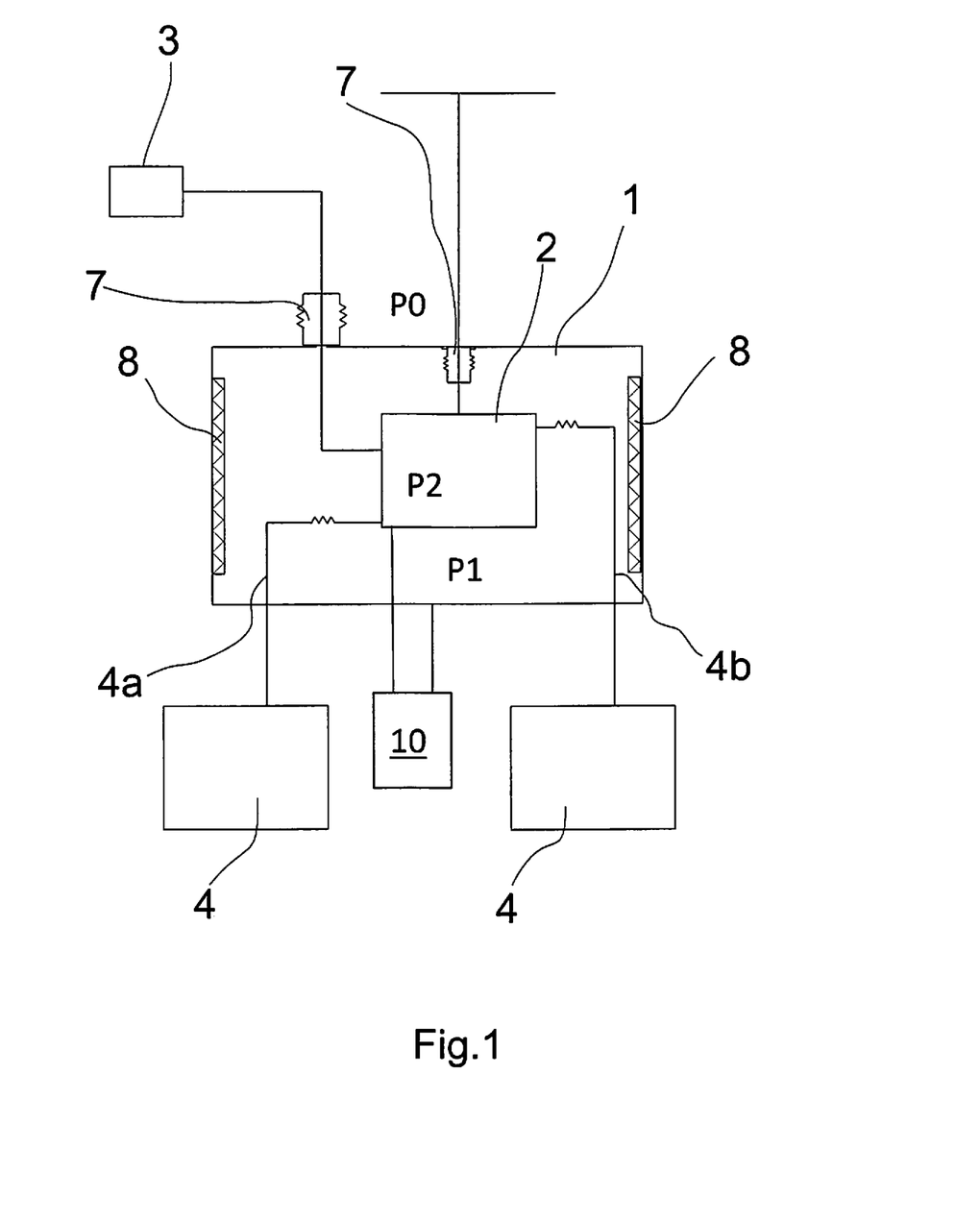
FIG. 1 shows a first embodiment of the apparatus according to the invention.

FIG. 1 shows a first embodiment of the apparatus according to the invention in which the apparatus comprises a vacuum chamber 1 and a reaction chamber 2 for particulate matter which the reaction chamber 2 is provided inside the vacuum chamber 1. The apparatus further comprises a vibration mechanism 3 for vibrating particulate matter inside the reaction chamber 2 and a precursor system 4 arranged to supply the at least first and second gaseous precursors through the reaction chamber 2 for subjecting the particulate matter to the at least first and second gaseous precursors. In this embodiment of the invention the reaction chamber 2 is suspended by a vibration mechanism 3 arranged outside the vacuum chamber 1 and by a connection also outside the vacuum chamber 1. The connection between the reaction chamber 2 and the vacuum chamber 1 is arranged through a damping element 7 such that vibrations are not transferred to the vacuum chamber 1. The damping elements 7 must naturally be gas tight as the connection leads from outside of the vacuum chamber 1 which is at room temperature and atmospheric pressure into the vacuum chamber 1 having a process pressure of a fraction of the atmospheric pressure such as 0.1-10 mbar. The reaction chamber 2 comprises the particulate matter to be processed according to the principles of ALD. The vibration mechanism 3 provides vibration to the reaction chamber 2 such that the particulate matter inside the reaction chamber 2 moves. In this embodiment of the invention the vibration mechanism 3 is arranged to vibrate the reaction chamber 2 such that the vibration of the reaction chamber 2 makes the particulate matter to vibrate. A precursor system 4 is arranged to supply the at least first and second gaseous precursors through the reaction chamber 2. The precursor system 4 comprises an inlet 4a to supply the gaseous precursors to the reaction chamber 2 and preferably to the bottom part of the reaction chamber 2 and an outlet 4b to discharge the gaseous precursors from the reaction chamber 2 and preferably from the top part of the reaction chamber 2. In this embodiment of the invention the precursor system 4 is arranged outside the vacuum chamber 1 such that the inlet 4a is arranged to go through the vacuum chamber 1 and to the reaction chamber 2. In the embodiment of the invention shown in FIG. 1 the vacuum chamber 1 further comprises heaters 8 arranged in the inner walls of the vacuum chamber 1. Although the figure shows only two heaters 8 there may a heater 8 in all the walls of the vacuum chamber 1 or just one heater 8 arranged to a place in the vacuum chamber 1 in which it provides most efficiently indirect heat to the reaction chamber 2.

Figure 2:
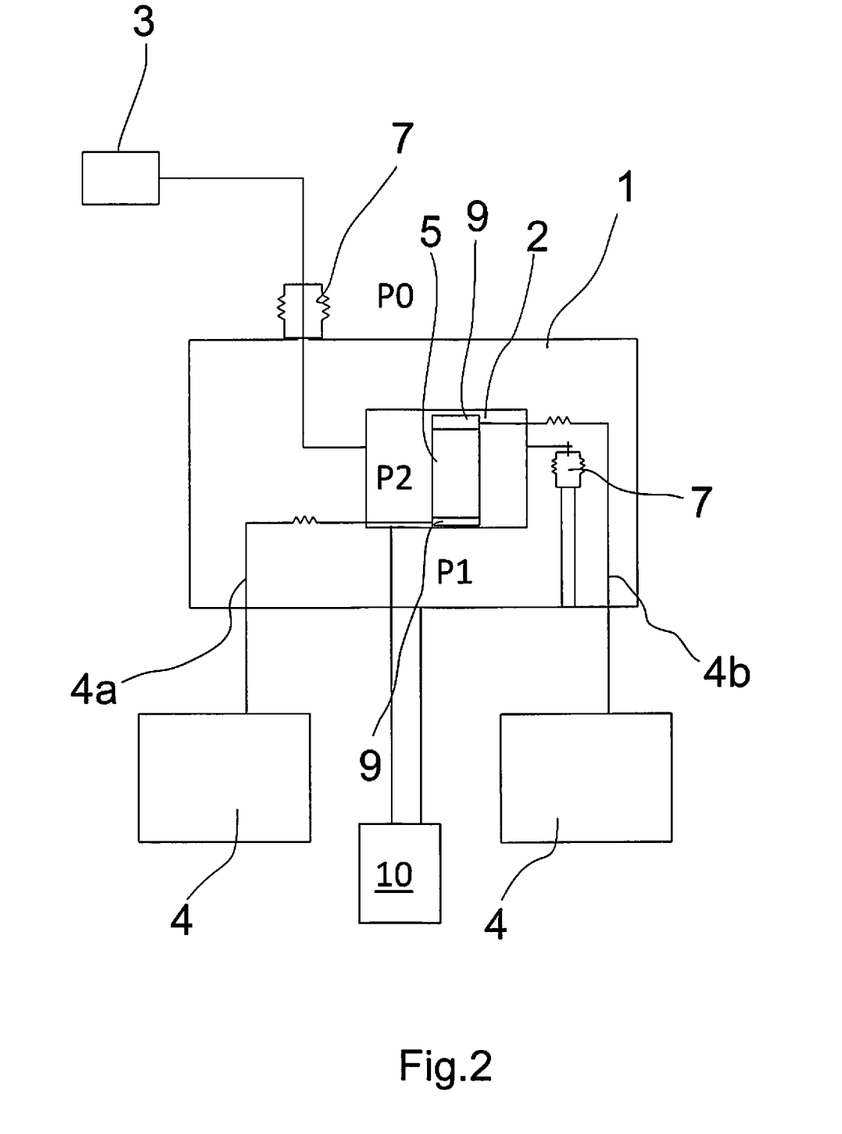
FIG. 2 shows a second embodiment of the apparatus according to the invention.

FIG. 2 shows a second embodiment of the apparatus according to the invention in which the reaction chamber 2 arranged inside the vacuum chamber 1 is coupled to the vacuum chamber 1 through a damping element 7 provided in connection with the floor of the vacuum chamber 1. Another coupling between the vacuum chamber 1 and the reaction chamber 2 is through another damping element 7 in connection with the vibration mechanism 3. In this embodiment the particulate matter is arranged in a container 5 which is arranged inside the reaction chamber 2. The vibration mechanism 3 is arranged to vibrate the reaction chamber 2 such that the container 5 inside the reaction chamber 2 vibrates. The precursor system 4 comprising the inlet 4a and the outlet 4b are arranged in the embodiment shown in FIG. 2 such that the inlet 4a for supplying gaseous precursor and the outlet 4b for discharging gaseous precursor are arranged to extend from the outside of the vacuum chamber 1 through the vacuum chamber 1 and through the reaction chamber 2 to the container 5. The precursor system 4 is arranged such that the coupling between the vacuum chamber 1 and the reaction chamber 2 is dampened so that the vibrations from the reaction chamber 2 are not transferred to the structures of the vacuum chamber 1. The inlet 4a of the precursor system 4 is connected to a sinter 9 in connection with the container 5 such that the gaseous precursor is supplied through the sinter 9 to provide a uniform flow and the outlet 4b is connected to another sinter 9 on top of the container 5 to prevent particulate matter escaping the container 5. The gaseous precursors coming through the first sinter 9 flow through the container 5 and are exhausted through the second sinter 9 and out from the container 5. In this embodiment shown in FIG. 2 there are no separate heaters shown but the environment in which the particulate matter is processed is provided with a uniform heating.

Figure 3:
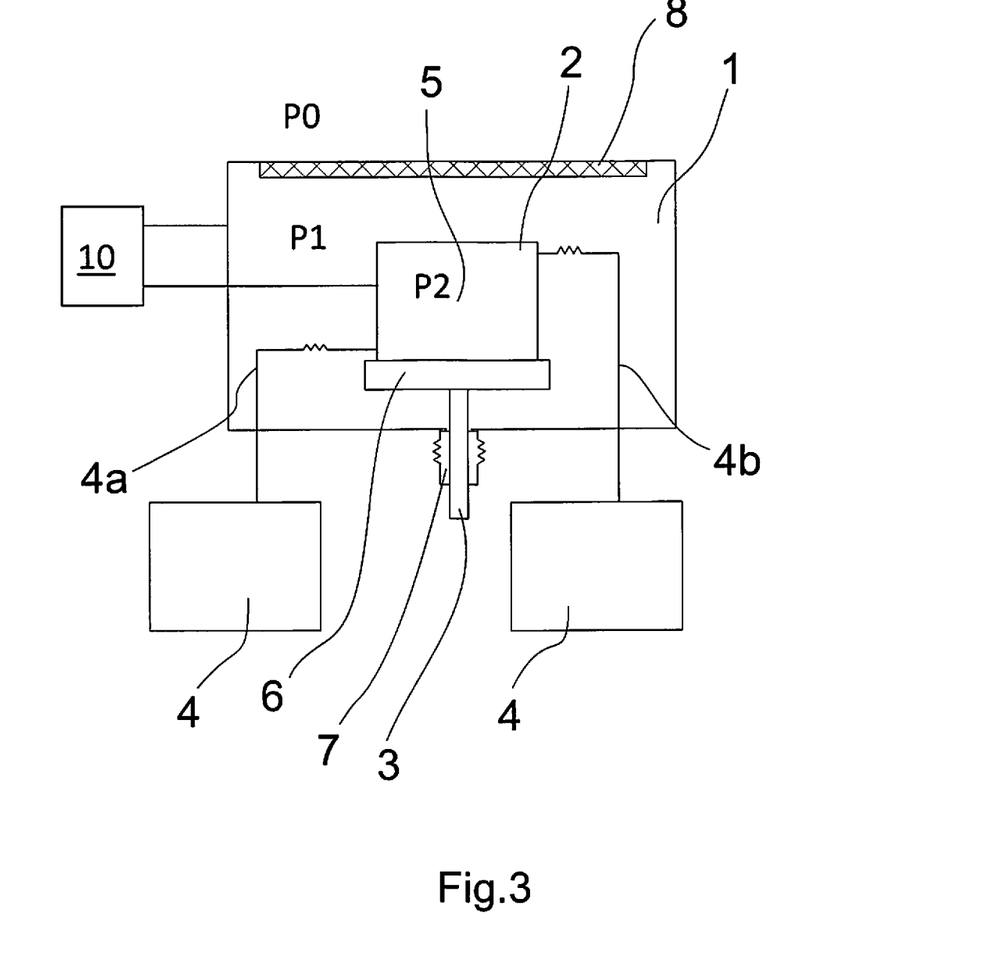
FIG. 3 shows a third embodiment of the apparatus according to the invention.

In FIG. 3 a third embodiment of the apparatus according to the invention is shown in which the reaction chamber 2 is provided in a platform 6 comprising a vibration mechanism 3. The platform 6 is arranged such that the vibration mechanism 3 vibrates the platform 6 and vibrations are transferred to the reaction chamber 2 for vibrating the particulate matter inside the reaction chamber 2. The vibration mechanism 3 is arranged such that it is isolated from the vacuum chamber 1 with a damping element 7 so that vibrations from the reaction chamber and from the platform 6 are not transferred to the vacuum chamber 1, i.e. to the structure of the vacuum chamber 1. The precursor system 4 is arranged similarly as in previous figures. A heater 8 is provided in the ceiling of the vacuum chamber 1 for providing a uniform heating to the reaction chamber 2. So the vacuum chamber 1 comprises at least one heater 8 arranged on the inner ceiling of the vacuum chamber 1 for indirect heating of the reaction chamber 2.

Figure 4:
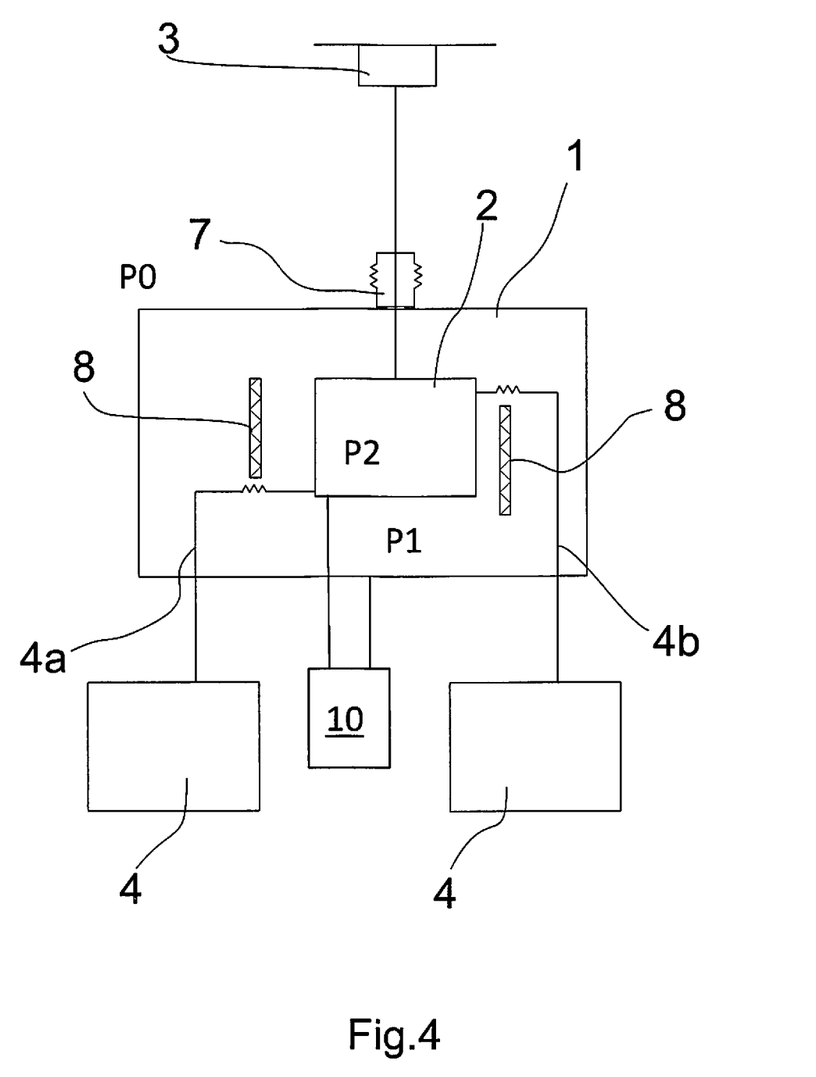
FIG. 4 shows a fourth embodiment of the apparatus according to the invention.

In FIG. 4 a fourth embodiment of the apparatus according to the invention is shown in which the reaction chamber 2 is arranged in a hanging manner through the vibration mechanism 3. The coupling between the vacuum chamber 1 and the vibration mechanism 3 is dampened through the damping element 7. In this embodiment of the invention the heaters 8 are arranged between the inner walls of the vacuum chamber 1 and the outer walls of the reaction chamber 2 for indirect heating of the particulate matter inside the reaction chamber 2.

Figure 5:
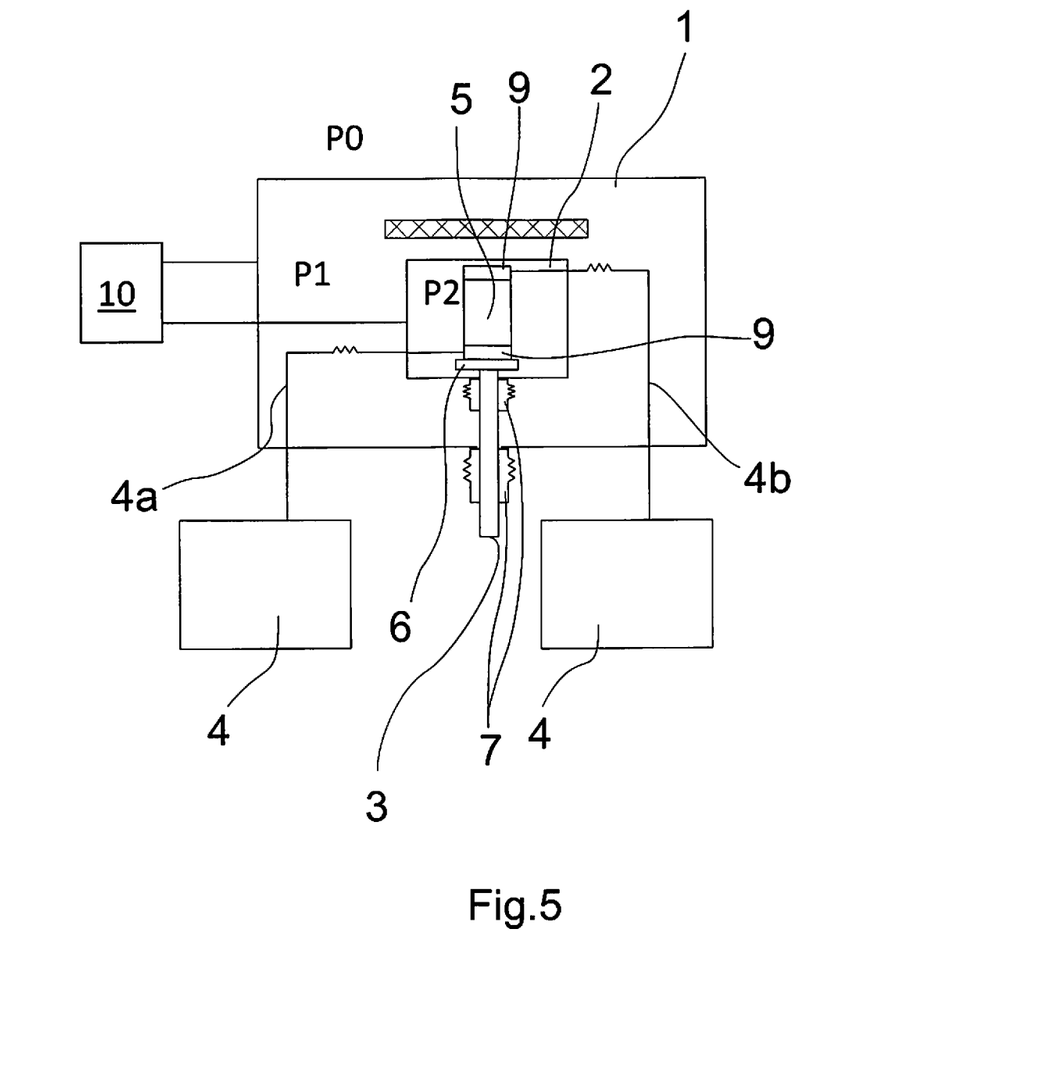
FIG. 5 shows a fifth embodiment of the apparatus according to the invention.

In FIG. 5 a fifth embodiment of the apparatus according to the invention is shown in which the reaction chamber 2 for particulate matter comprises a container 5 comprising the particulate matter and the reaction chamber 2 is provided inside the vacuum chamber 1. The vibration mechanism 3 for vibrating particulate matter inside the reaction chamber 2 and in this particular embodiment inside the container 5 is arranged in connection with a platform 6 so that the container 5 is arranged in a platform 6 comprising a vibration mechanism 3. In this embodiment the container 5 itself is arranged to vibrate and damping elements 7 are provided between the reaction chamber 2 and the vibration mechanism 3 and between the vacuum chamber 1 and the vibration mechanism 3 so that vibration is prevented from the structures of the reaction chamber 2 and the structures of the vacuum chamber 1. FIG. 5 also shows that the at least one heater 8 is arranged between the inner walls of the vacuum chamber 1 and the outer walls of the reaction chamber 2 for indirect heating of the particulate matter inside the reaction chamber 2 and in this embodiment the heater is arranged on the side of the ceiling of the vacuum chamber 1.

As shown in the figures the reaction chamber 2 is arranged inside the vacuum chamber 1 such that the reaction chamber 2 and the vacuum chamber 1 are mechanically separated from each other such that the vibration of the vacuum chamber 1 is prevented. The mechanically separated means that there is preferably a damping element 7 or similar between the vacuum chamber 1 and the reaction chamber 2 so that vibrations from the reaction chamber or from the container 5 are not transferred to the vacuum chamber 1 and especially to the structures of the vacuum chamber 1. In the embodiments shown in FIGS. 1-4 the vibration mechanism 3 is operatively connected to the reaction chamber 2 for vibrating the reaction chamber 2 and further in FIG. 2 the vibration mechanism 3 is operatively connected to the reaction chamber 2 for vibrating the reaction chamber 2 and the container 5 inside the reaction chamber 2. In the embodiment shown in FIG. 5 the vibration mechanism 3 is operatively connected to the container 5 for vibrating the container 5 inside the reaction chamber 2. The vibration mechanism 3 may be arranged as a vibrating arm or like as in FIGS. 1, 2 and 4 or as a platform as in FIGS. 3 and 5. In FIG. 3 the reaction chamber 2 is arranged in a platform 6 comprising the vibration mechanism 3 and in FIG. 5 the container 5 is arranged in a platform 6 comprising the vibration mechanism 3.

All the embodiments shown in the figures show that the reaction chamber 2 is connected to the vibration mechanism 3 arranged outside of the vacuum chamber 1, which is the most preferable embodiment.

The apparatus comprises damping elements 7 which are provided for dampening the vibrations coming from the reaction chamber 2 or in some embodiments from the container 5 such that they are not transferred to the structures of the vacuum chamber 1. So the reaction chamber 2 and the vacuum chamber 1 are connected together through at least one damping element 7 that is arranged to prevent vibrations transferring to the vacuum chamber 1.

For creating a uniform heating toward the particulate matter inside the reaction chamber 2 the vacuum chamber 1 comprises at least one heater 8 arranged between the inner walls of the vacuum chamber 1 and the outer walls of the reaction chamber 2 for indirect heating of the particulate matter inside the reaction chamber 2 or for indirect heating of the container 5 inside the reaction chamber 2. Although not shown in the figures the heater may also be arranged on the floor of the vacuum chamber 1.

As shown in all the figures the precursor system 4 comprises an inlet 4*a* arranged to supply the at least first and second gaseous precursors into the reaction chamber 2 and in the embodiments that comprises a container 5 also inside the container 5 and an outlet 4*b* arranged to discharge the at least first and second gaseous precursors from the reaction chamber 2 or in the embodiments comprising a container 5 first from the container and out of the reaction chamber 2. The inlet 4*a* and the outlet 4*b* are provided with dampers (shown with serration) for preventing the vibrations transferring further through the inlet and outlet. Although the figures show only one inlet 4*a* there may naturally be more than one inlet 4*a* and preferably there are two inlets 4*a* arranged to supply the at least first and second gaseous precursors into the reaction chamber 2. The inlet 4*a* is arranged to go through the vacuum chamber 1 from outside of the vacuum chamber 1 into the reaction chamber 2 and the outlet 4*b* is arranged to go from the reaction chamber 2 through the vacuum chamber 1 out of the vacuum chamber 1. The inlet 4*a* is arranged to go through the walls of the vacuum chamber 1 such that the inlet 4*a* is arranged to extend from the inner walls of the vacuum chamber 1 through the vacuum chamber 1 to the outer walls of the reaction chamber 2 and through the walls of the reaction chamber 2. The outlet 4*b* is arranged to extend between the outer walls of the reaction chamber 2 through the vacuum chamber 1 and the inner walls of the vacuum chamber 1 and such that the outlet 4*b* is arranged to go through the walls of the reaction chamber 2 and the walls of the vacuum chamber 1.

In all the embodiments shown in FIGS. 1-6 the particulate matter may be provided directly inside the reaction chamber 2 or in a container 5 arranged inside the reaction chamber 2. So in the FIGS. 2 and 5 the apparatus further comprises a container 5 for particulate matter, said container 5 is arranged inside the reaction chamber 2. In the case that a container 5 comprising particulate matter is arranged inside the reaction chamber 2 the vibration mechanism 3 is provided to direct the vibration to the container 5 inside the reaction chamber 2 such that the particulate matter inside the container 5 moves. If the vibration mechanism 3 is arranged to vibrate the reaction chamber 2 it is arranged to vibrate such that the vibration of the reaction chamber 2 makes the container 5 to vibrate. Also the precursor system 4 is arranged to supply the at least first and second gaseous precursors to the reaction chamber 2 or through the reaction chamber 2 to the container 5. In the case there is a container 5 inside the reaction chamber 2 the precursor system 4 is arranged to supply the gaseous precursors to the container 5 and preferably to the bottom part of the container 5 and to discharge the gaseous precursors from the container 5 and preferably from the top part of the container 5. There is preferably a sinter 9 arranged in the bottom part of the container 5 and another sinter 9 in the top part of the container 5 such that the gaseous precursors are supplied through the sinter 9 into the container 5 for providing a uniform gas flow. The other sinter 9 in the top part of the container 5 prevents particulate matter from escaping the container together with the gas flow through the outlet 4*b*. The precursor system 4 is connected to the reaction chamber 2 and to the sinters 9 of the container 5 such that the vibrations from the container 5 are not transferred outside the reaction chamber 2, i.e. the vibrations are not transferred to the structures of the vacuum chamber 1. The sinters 9 may be arranged in the reaction chamber 2 such that only the container 5 is removable from the reaction chamber 2 or at least one of the sinters 5 may be an integral part of the container 5.

Pressure in the reaction chamber 2 is lower than pressure in the vacuum chamber 1 and the sealing of the reaction chamber 2 is based on the pressure difference. The sealing of the reaction chamber 2 is arranged by pressing a metal surface against a metal surface, i.e. the structures of the reaction chamber 2 form the sealing and no actual sealing parts, such as O-rings of elastomeric material not capable of withstanding high process temperatures, provided between the structures of the reaction chamber 2 as they are not needed. This allows higher temperatures during processing the particulate matter because there are no elastomeric material provided in the structures.

The apparatus according to the invention comprises an outer chamber which is the vacuum chamber 1 and an inner chamber inside the vacuum chamber 1. Said inner chamber comprises particulate matter and precursors that are supplied into the inner chamber. The inner chamber is the reaction chamber 2.

FIGS. 1-5 show that the apparatus further comprises a pressure device 10 arranged to provide a first pressure P1 in the vacuum chamber 1 and/or a second pressure P2 in the reaction chamber 2, which the first pressure P1 is higher than the second pressure P2. The pressure P0 outside of the apparatus is higher than the first pressure P1 or the second pressure P2. The pressure device 10 comprises one or more vacuum pumps or the like. Alternatively, the apparatus comprises one or more pressure devices 10 such as vacuum pumps or the like.

So, all the FIGS. 1-5 show an apparatus according to the invention which comprises a vacuum chamber 1, a reaction chamber 2, which the reaction chamber 2 is provided inside the vacuum chamber 1, a vibration mechanism 3 and a precursor system 4. The precursor system 4 comprises an inlet 4a and said precursor system 4 is arranged outside the vacuum chamber 1 such that the inlet 4a is arranged to go through the vacuum chamber 1 and to the reaction chamber 2. In the method for processing particulate matter in the apparatus the steps of supplying the at least first and second gaseous precursors through the reaction chamber 2 for subjecting the particulate matter to the at least first and second gaseous precursors, and vibrating particulate matter inside the reaction chamber 2 are carried out for providing a uniform coating to the particulate matter.

The method preferably further comprises a step of creating a flow in a direction against gravity in the reaction chamber 2 for moving the particulate matter. This brings the particulate matter to flow inside the reaction chamber 2 which helps the first and second gaseous precursors to reach all over the particulate matter. Therefore, the particulate matter may be fluidized with the help of vibration and flow. The flow in a direction against gravity may be in the direction directly against gravity or in an angle against gravity. Typically, this means that the direction is vertical or at least partly vertical. In other words, there is preferably a fluidization flow against the gravity such that vibration together with the fluidization flow leads to continuous particulate matter mixing and avoids channel formation in which precursor gases form paths and do not spread all over the reaction chamber leading to uneven coating of particulate matter. In other words, a flow with a gas, preferably with an inert gas, keeps the particulate matter floating in the reaction chamber 2 with an upward directed flow.

The precursor system 4 may comprise an inert gas supply to the reaction chamber 2 such that the particulate matter is arranged to flow inside in the reaction chamber 2. In other words, the method comprises a step of supplying inert gas to the reaction chamber 2 from the precursor system 4 for moving the particulate matter inside the reaction chamber 2. Inert gas may be supplied between the supply of the first and second precursor gases or the inert gas may be supplied continuously to the reaction chamber 2. With the help of inert gas the particulate matter is kept in fluidized form between feeding the precursor gases or continuously.

The method further comprises steps of providing a first pressure P1 in the vacuum chamber 1 and a second pressure P2 in the reaction chamber 2, which the first pressure P1 is higher than the second pressure P2 and the pressure P0 outside of the apparatus is higher than the first pressure P1 and the second pressure P2. When the particulate matter is arranged in a container 5 inside the reaction chamber 2 then the reaction chamber 2 and the container 5 have the same pressure P2 and the inlet 4a and the outlet 4b are arranged to extend through the reaction chamber 2 to the container 5.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus for processing particulate matter by exposing the particulate matter to successive surface reactions of at least a first and a second gaseous precursor according to the principles of atomic layer deposition, the apparatus comprising:
   a vacuum chamber;
   a reaction chamber for particulate matter, the reaction chamber provided inside the vacuum chamber;
   a vibration mechanism for vibrating particulate matter inside the reaction chamber; and
   a precursor system arranged to supply the at least first and second gaseous precursors through the reaction chamber for subjecting the particulate matter to the at least first and second gaseous precursors, the precursor system comprises an inlet and said precursor system is arranged outside the vacuum chamber such that the inlet is arranged to go through the vacuum chamber and to the reaction chamber, wherein the reaction chamber is arranged inside the vacuum chamber such that the reaction chamber and the vacuum chamber are mechanically separated from each other, and such that vibration of the vacuum chamber is prevented.

2. The apparatus according to claim 1, wherein the vibration mechanism is operatively connected to the apparatus and arranged to vibrate at least a part of the apparatus for vibrating particulate matter inside the reaction chamber.

3. The apparatus according to claim 1, wherein the vibration mechanism is operatively connected to the reaction chamber for vibrating the reaction chamber.

4. The apparatus according to claim 1, wherein the reaction chamber is connected to the vibration mechanism arranged outside of the vacuum chamber.

5. The apparatus according to claim 1, wherein the reaction chamber and the vacuum chamber are connected together through at least one damping element that is arranged to prevent vibrations transferring to the vacuum chamber.

6. The apparatus according to claim 1, wherein the vacuum chamber comprises at least one heater arranged between the inner walls of the vacuum chamber and the outer walls of the reaction chamber for indirect heating of the particulate matter inside the reaction chamber.

7. The apparatus according to claim 1, wherein the vacuum chamber comprises at least one heater arranged on an inner ceiling of the vacuum chamber for indirect heating of the reaction chamber.

8. The apparatus according to claim 1, wherein the apparatus further comprises a pressure device arranged to provide at least one of a first pressure in the vacuum chamber or a second pressure in the reaction chamber, wherein the first pressure is higher than the second pressure.

9. The apparatus according to claim 1, wherein the precursor system comprises an inlet arranged to supply the gaseous precursors to the reaction chamber and an outlet arranged to discharge the gaseous precursors from the reaction chamber.

* * * * *